(12) United States Patent
Xie et al.

(10) Patent No.: US 12,256,554 B2
(45) Date of Patent: Mar. 18, 2025

(54) EMBEDDED MRAM INTEGRATED WITH SUPER VIA AND DUMMY FILL (71) Applicant: International Business Machines Corporation, Armonk, NY (US)

(72) Inventors: Ruilong Xie, Niskayuna, NY (US); Kangguo Cheng, Schenectady, NY (US); Dimitri Houssameddine, Sunnyvale, CA (US); Julien Frougier, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 598 days.

(21) Appl. No.: 17/485,768

(22) Filed: Sep. 27, 2021

(65) Prior Publication Data

US 2023/0098033 A1    Mar. 30, 2023

(51) Int. Cl.
*H10B 61/00* (2023.01)
*H10N 50/01* (2023.01)
*H10N 50/80* (2023.01)

(52) U.S. Cl.
CPC ............. *H10B 61/00* (2023.02); *H10N 50/01* (2023.02); *H10N 50/80* (2023.02)

(58) Field of Classification Search
CPC ......... H10B 61/00; H10N 50/01; H10N 50/80
See application file for complete search history.

(56) References Cited

U.S. PATENT DOCUMENTS

| | | | |
|---|---|---|---|
| 5,674,784 A | 10/1997 | Jang | |
| 9,397,139 B1 * | 7/2016 | Tan | H10B 61/00 |
| 9,595,662 B2 | 3/2017 | Li | |
| 9,704,919 B1 | 7/2017 | Lu | |
| 10,121,964 B2 | 11/2018 | Tan | |
| 10,199,572 B2 | 2/2019 | Yi | |
| 10,312,434 B2 | 6/2019 | Briggs | |
| 10,483,461 B2 | 11/2019 | Yi | |
| 10,797,224 B2 | 10/2020 | Raghavan | |
| 2012/0241880 A1 * | 9/2012 | Noma | H01L 29/82 257/E29.323 |
| 2018/0182810 A1 * | 6/2018 | Yi | H10B 61/10 |
| 2018/0205002 A1 * | 7/2018 | Bak | G11C 11/161 |
| 2018/0366640 A1 * | 12/2018 | Clevenger | H10B 61/00 |
| 2019/0006222 A1 | 1/2019 | Or-Bach | |
| 2020/0075669 A1 | 3/2020 | Chuang | |
| 2020/0388648 A1 * | 12/2020 | Kuo | H10B 61/22 |
| 2021/0091302 A1 | 3/2021 | Reznicek | |
| 2021/0126051 A1 * | 4/2021 | Dutta | H10B 61/00 |

(Continued)

OTHER PUBLICATIONS

W. Boullart, et al., "STT MRAM patterning challenges," Proceedings of SPIE—The International Society for Optical Engineering 8685:86850F, Mar. 2013, pp. 1-9.

(Continued)

*Primary Examiner* — Fernando L Toledo
*Assistant Examiner* — Marshall Mu-Nuo Hatfield
(74) *Attorney, Agent, or Firm* — Daniel Morris; Otterstedt & Kammer PLLC (57) ABSTRACT

A device includes a plurality of magnetic random-access memory (MRAM) cells in a first region of the device; and a dummy MRAM pillar disposed in a second region of the device, wherein the dummy MRAM pillar is not connected to an active metal feature.

20 Claims, 11 Drawing Sheets (56) References Cited

U.S. PATENT DOCUMENTS

2021/0225933 A1* 7/2021 Tsai ................ H10N 50/80

OTHER PUBLICATIONS

Eugene J. O'sullivan, "A Novel Selective Freelayer Wet Etching Method for Magnetic Tunnel Junction-Based MRAM," ECS Transactions 3(25), DOI:10.1149/1.2753272, Aug. 2007, (Abstract only) pp. 1-2.

Jae Yong Lee, et al., "Dry etching of palladium thin films in high density plasmas of CH3OH/Ar, C2H5OH/Ar, CH4/Ar, and CH4/O2/Ar gas mixtures" Thin Solid Films vol. 636, Aug. 31, 2017, pp. 1-8.

Chee Won Chung et al., "Effect of etch gases on iridium etching using a hard mask" Sep. 2006 (Abstract only) pp. 1-3.

Chia-Pin Yeh, "High temperature reactive ion etching of iridium thin films with aluminum mask in CF4/O2/Ar plasma", AIP Advances 6, 085111 (2016); doi: 10.1063/1.4961447, pp. 1-9.

Su Min Hwang, "Etch characteristics of MgO thin films in Cl2/Ar, CH3OH/Ar and CH4/Ar plasmas", Mar. 2014, Vacuum 101: pp. 394-398.

Sara Paoilil, et al. "Direct metal etch of ruthenium for advanced interconnect" Journal of Vacuum Science and Technology B: Nanotechnology and Microelectronics 36(3), May 2018, (Abstract only) p. 1.

* cited by examiner

EMBEDDED MRAM INTEGRATED WITH SUPER VIA AND DUMMY FILL

BACKGROUND

Magnetic Random-Access Memory (MRAM) is an important memory technology. Spin Transfer Torque (STT) MRAM is an example MRAM implementation. STT-MRAM has been identified as a potential universal memory with potential markets extending from Flash replacement (MRAM-F) to SRAM replacement (MRAM-S). STT-MRAM is a type of MRAM device. STT-MRAM enables higher densities, low power consumption and reduced cost compared to regular or toggle MRAM devices.

The conventional STT-MRAM is a 2-terminal device. An example configuration of the STT-MRAM device includes one MRAM cell, one driver transistor, one word line, and one bit line. The STT-MRAM device may be integrated on top of a driver transistor.

Co-integration of STT-MRAM with LOGIC requires increasing the thickness of an inter-layer dielectric to buffer the thickness of the bottom electrode (BE)+MRAM structure. The inter-level LOGIC via height needs to increase to accommodate the BE+MRAM insertion, which requires re-developing the LOGIC via integration.

BRIEF SUMMARY

According to embodiments of the present invention, a device includes a plurality of magnetic random-access memory (MRAM) cells in a first region of the device; and a dummy MRAM pillar disposed in a second region of the device, wherein the dummy MRAM pillar is not connected to an active metal feature.

According to embodiments of the present invention, a device includes a plurality of lower metal lines; a plurality of upper metal lines; a plurality of magnetic random-access memory (MRAM) cells in a first region of the device and electrically connected to respective ones of the lower metal lines and the upper metal lines; a super via disposed in a second region of the device and electrically connected to a respective one of the lower metal lines and a respective one of the upper metal lines; and a dummy MRAM pillar disposed in a third region of the device.

According to embodiments of the present invention, a method of forming a device comprises: forming a plurality of magnetic random-access memory (MRAM) cells in a first region of the device; forming a dummy MRAM pillar in a second region of the device; exposing upper surfaces of the plurality of MRAM cells; and depositing a metal forming a plurality of upper metal lines over the plurality of MRAM cells.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware mod-ule(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. Some embodiments may not have these potential advantages and these potential advantages are not necessarily required of all embodiments. For example, one or more embodiments may provide for:

a device including co-integrated embedded MRAM and a super via; and dummy MRAM structure in a device indicating a CMP end-point for removal of a low-k ILD.

These and other features and advantages of the present invention will become apparent from the following detailed description of illustrative embodiments thereof, which is to be read in connection with the accompanying drawings.

BRIEF DESCRIPTION OF THE DRAWINGS

Preferred embodiments of the present invention will be described below in more detail, with reference to the accompanying drawings.

DETAILED DESCRIPTION

According to embodiments of the present invention, an integrated device includes an embedded Magnetic Random-Access Memory (MRAM) and a super via. According to some embodiments, an integrated device includes a dummy MRAM, ensuring a chemical-mechanical polish (CMP) end-point of a low-k interlevel dielectric (ILD).

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., Silicon VLSI Technology: Fundamentals, Practice, and Modeling 1st Edition, Prentice Hall, 2001 and P. H. Holloway et al., Handbook of Compound Semiconductors: Growth, Processing, Characterization, and Devices, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Figure 1:
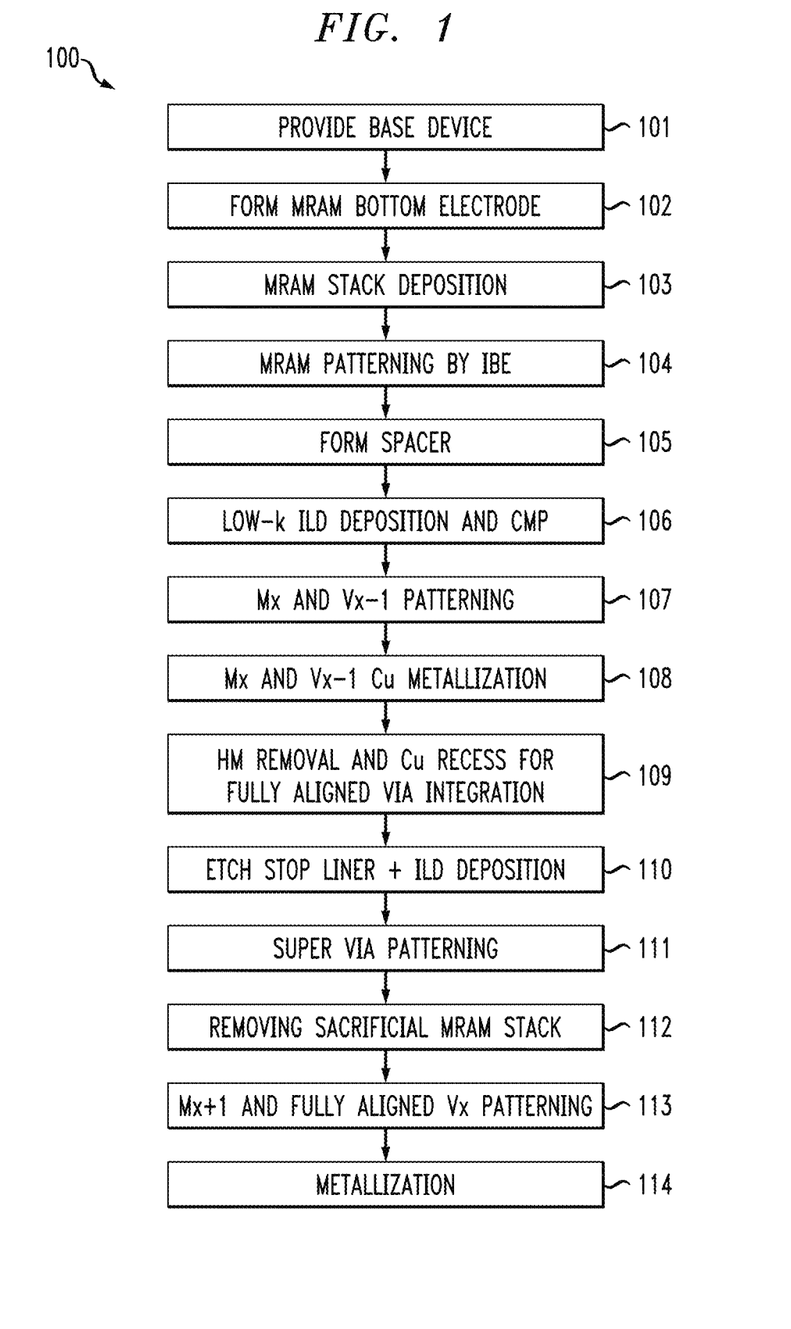
FIG. 1 is method of manufacturing an embedded MRAM integrated with a super via and a dummy fill according to one or more embodiments of the present invention.

FIG. 1 is method 100 of manufacturing an embedded MRAM integrated with a super via and a dummy fill according to one or more embodiments of the present invention. According to FIG. 1, the method 100 includes providing a base device at step 101, including first metal features disposed in a first ILD, and forming MRAM bottom electrodes at step 102 contacting the first metal features and in a second ILD disposed over the base device.

According to some embodiments, the base device includes an MRAM region, a second region, and a dummy fill region. According to at least one embodiments, the dummy fill region does not include first metal features of MRAM bottom electrodes. According to example, embodiments, an MRAM bottom electrode is not formed over at least one of the first metal features in the second region.

According to some embodiments, the method comprises sequentially depositing layers of an MRAM stack at step 103 over the device, including a reference layer, a tunneling barrier, a free layer, a top electrode, and a hardmask (HM). According to at least one embodiment, the method can include forming a patterned MRAM stack by patterning the MRAM stack at step 104, e.g., by an Ion Beam Etching (IBE), forming spacers at step 105 on sidewalls of the patterned MRAM stack, and depositing a low-k ILD at step 106, i.e., a third ILD, which can be planarized, e.g., by a CMP (also at step 106) to the hardmask. According to example embodiments, the patterned MRAM stacks are disposed over the first metal features in the MRAM region and the second region, and over the second ILD in the dummy region.

According to some embodiments, the third ILD in the second region is patterned at step 107 forming line/contact trenches and via trenches in the third ILD, and a metallization at step 108 deposits a metal, such as copper (Cu), forming second metal features in the line/contact trenches and the via trenches. According to at least one embodiment, the method includes removing the hardmask covering the patterned MRAM stacks in the MRAM region, the second region, and the dummy fill region, and recessing the second metal features at step 109 in the second region, preparing the device for fully aligned via integration. According to some embodiments, the methods includes depositing an etch stop liner and a forth ILD at step 110 over the device, and patterning a super via at step 111 exposing the MRAM stack in the second region, and removing the MRAM stack in the second region (i.e., a sacrificial MRAM stack) at step 112, exposing the first metal features in the second region.

According to at least one embodiments, the method includes a patterning of top trenches and fully aligned via at step 113, the top trenches and fully aligned vias expose the MRAM stacks in the MRAM region and the second metal features in the second region. According to an example embodiment, the method includes a metallization at step 114 depositing second metal features in the top trenches/fully aligned via and the super via.

FIGS. 2-11 are cross-section views of a device at different steps in a manufacturing process of FIG. 1 according to one or more embodiments of the present invention.

Figure 2:
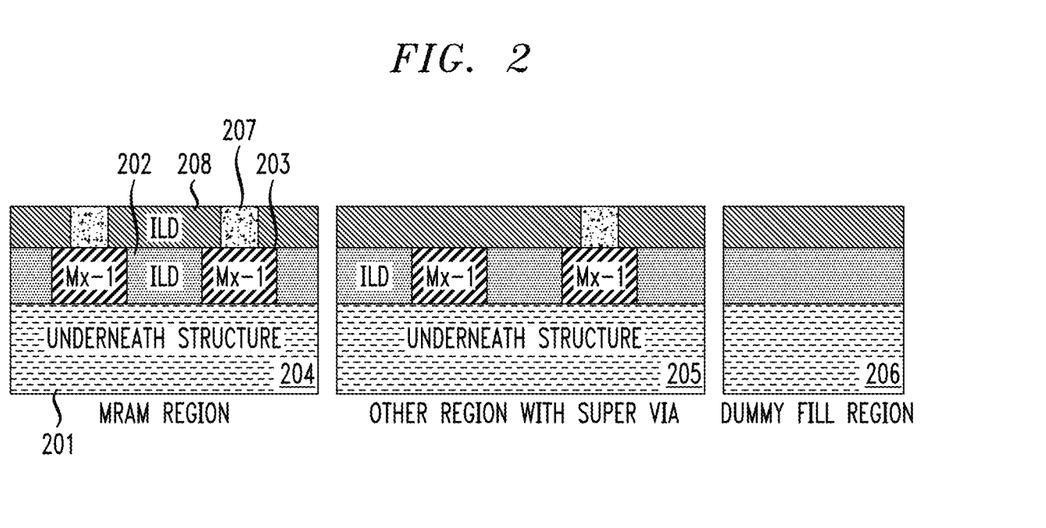
FIGS. 2-11 are cross-section views of a device at different steps in a manufacturing process of FIG. 1 according to one or more embodiments of the present invention.

FIG. 2 shows a base device comprising, for example, a substrate 201, a first ILD 202, and lower metal features (Mx−1) 203. It should be understood that the substrate 201 can be, for example, a semiconductor substrate, an electronic device, an interconnect structure, etc. According to example embodiments, the base device includes a first region 204, a second region 205, and a third region 206. According to some embodiments, the MRAM bottom electrodes 207 are disposed in the second ILD 208 on the base device.

According to at least one embodiments, the third region does not include an MRAM bottom electrode. According to example embodiment, an MRAM bottom electrode is not formed over at least one of the first metal features in the second region 205.

Figure 3:
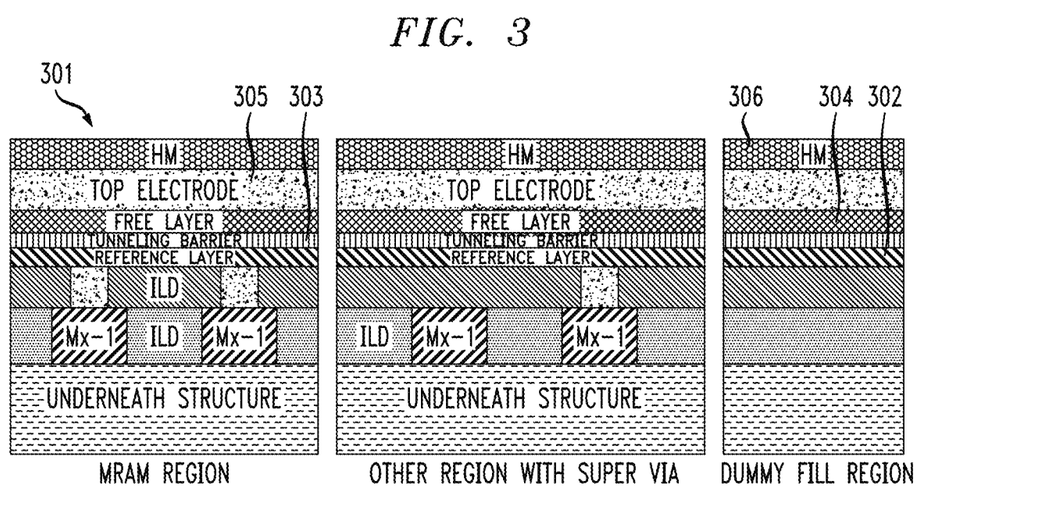

FIG. 3 shows the MRAM stack 301 comprising a reference layer 302, a tunneling barrier 303, a free layer 304, a top electrode 305, and a hardmask (HM) 306.

Figure 4:
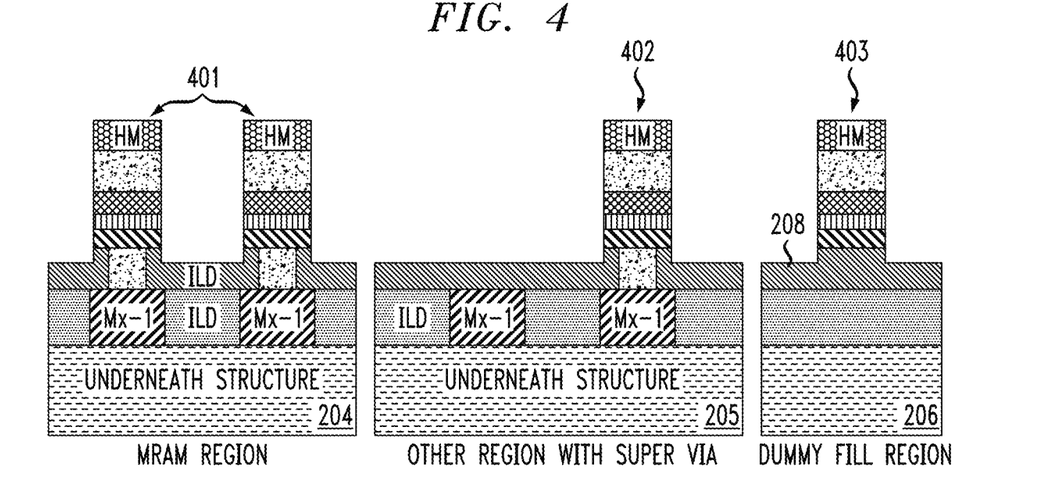

According to an example embodiment and as shown in FIG. 4 the MRAM stack can be patterned to form the patterned MRAM stacks 401, the sacrificial MRAM stack 402, and the dummy MRAM pillar 403. According to some embodiments, the patterning is formed by an IBE. According to example embodiments, the patterned MRAM stacks are disposed on the lower metal features in the first region 204 and the second region 205, and on the second ILD 208 in the third region 206. According to some embodiments, the reference layer, the tunneling barrier, and the free layer, patterned as part of the patterned MRAM stacks 401 form respective Magnetic Tunnel-Junctions (MTJ).

According to some embodiments, a dummy MRAM pillar 403 is formed by substantially the same steps as the patterned MRAM stack 401. According to an example embodiment, the dummy MRAM pillar 403 is disposed on the second ILD 208 in the third region 206. According to some embodiments, the dummy MRAM pillar 403 is not connected to an active metal feature (for example, a metal line, or via).

Figure 5:
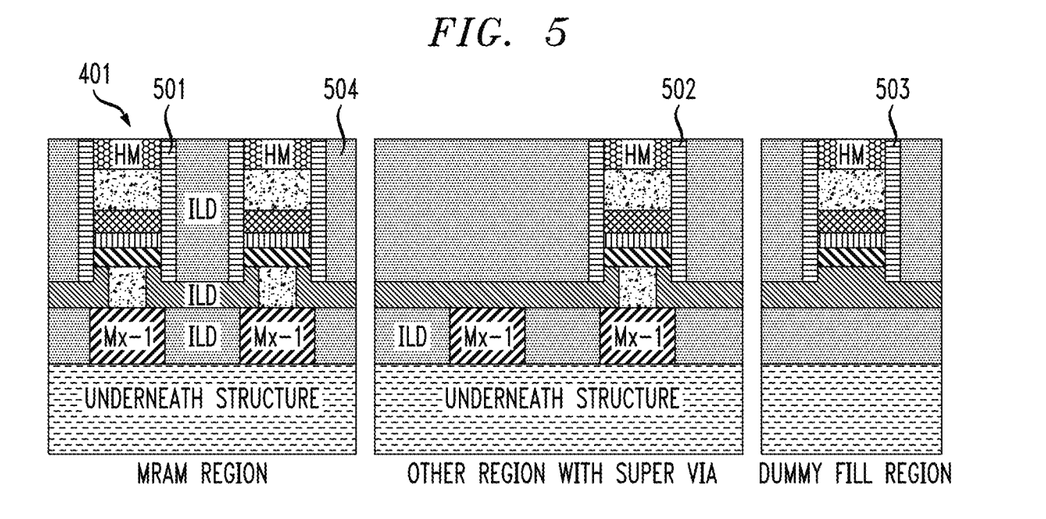

According to an example embodiment and as shown in FIG. 5, spacers 501-503 can be disposed on sidewalls of the patterned MRAM stacks 401, the sacrificial MRAM stack 402, and the dummy MRAM pillar 403. According to an example embodiment and as shown in FIG. 5, a low-k ILD 504 can be deposited over the device, e.g., between the patterned MRAM stacks 401, and planarized, for example, by CMP. According to some embodiments, control of CMP processes such as the CMP of an overburden portion (not shown) of the low-k ILD 504 (see also step 106, FIG. 1) can be well controlled, reducing or eliminating defects such as ILD dishing (e.g., the preferential removal of certain materials to a dielectric layer, which can lead to non-planarity of a surface), due to the location of dummy MRAM pillars 403 in various locations on the wafer, which can, for example, enhance the detection of CMP stop parameters (e.g., frictional differences, etc.).

Figure 6:
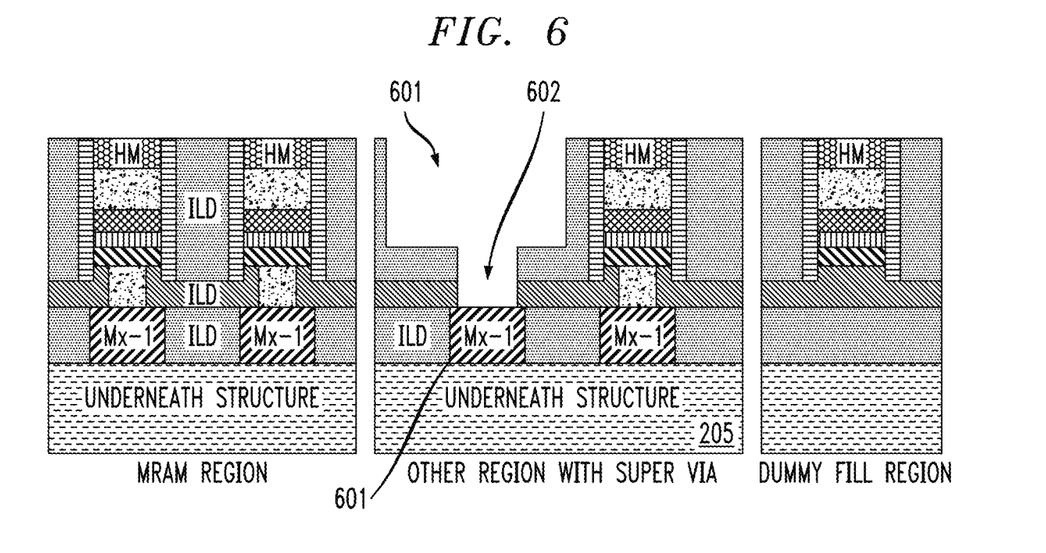
Figure 7:
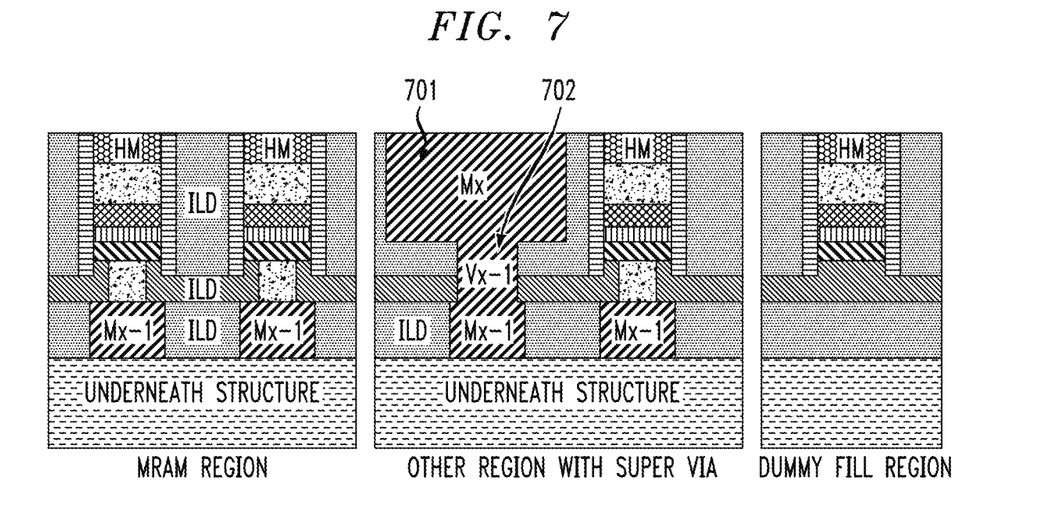

According to an example embodiment and as shown in FIG. 6, a first metal trench 601 and a second via 602 can be formed, e.g., patterned, in the low-k ILD 504. The first metal trench 601 and the second via 602 expose at least one lower metal feature 603 in the second region 205. According to an example embodiment and as shown in FIG. 7, a first metal feature 701 and a second metal feature 702, which can be formed by a conventional Cu dual damascene process.

According to at least one embodiment, the first metal feature 701 is a metal line (Mx), and the second metal feature 702 is a metal via (Vx−1). According to some example embodiments, the first metal feature 701 can be a metal line in a logic device region as an element of a back-end-of-line (BEOL) interconnect.

Figure 8:
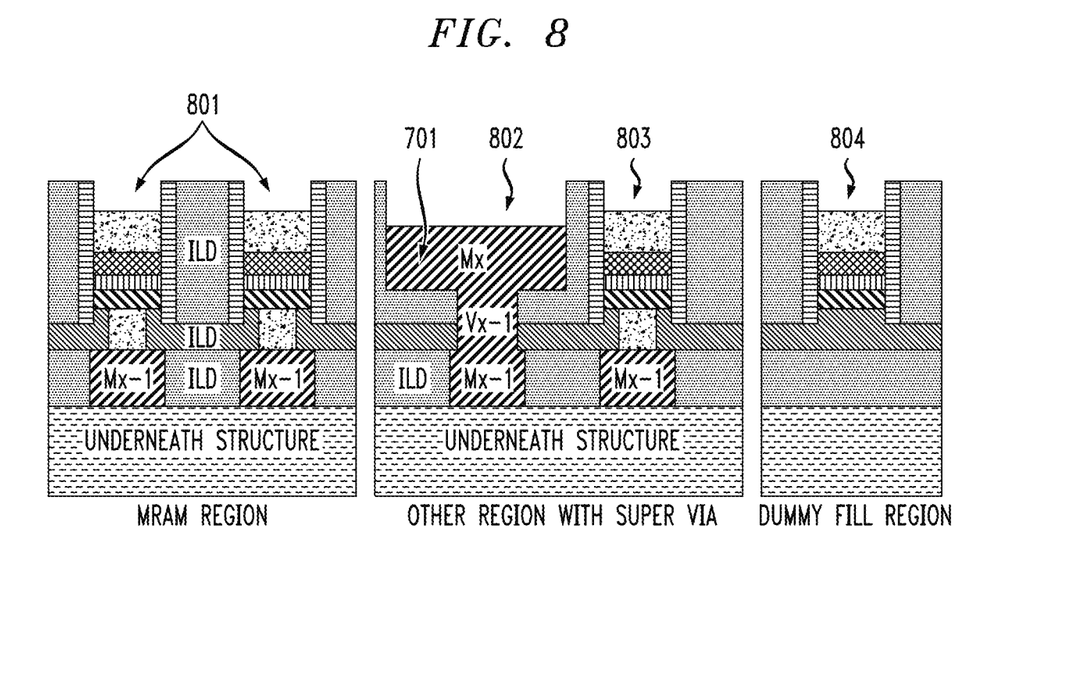
Figure 9:
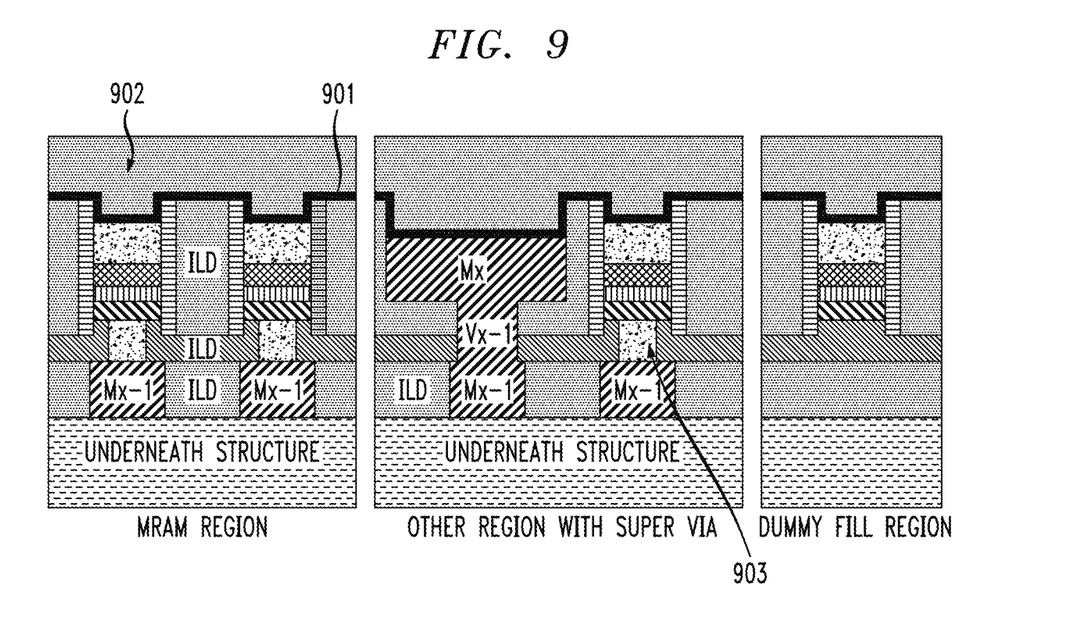

According to an example embodiment and as shown in FIG. 8, the hardmask (not shown) is removed and the first metal feature 701 is recessed forming first trenches 801 over the patterned MRAM stacks, a second trench 802 over the first metal feature 701 enabling a fully aligned via integration, a third trench 803 over a sacrificial MRAM stack, and a fourth trench 804 over a dummy MRAM pillar. According to an example embodiment and as shown in FIG. 9, an etch stop liner 901 and a fourth ILD 902 are deposited over the device and in the first through fourth trenches.

Figure 10:
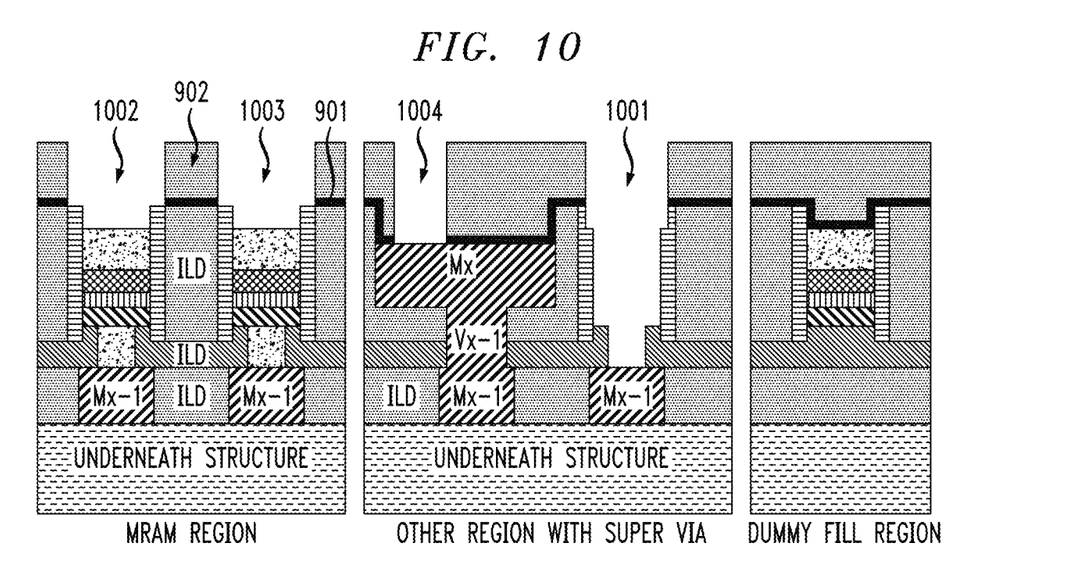

According to an example embodiment and as shown in FIG. 10, a super via trench 1001 is formed by a super via patterning exposing a sacrificial MRAM stack 803 (see FIG. 8), followed by the removal of the sacrificial MRAM stack 402 and a bottom electrode 903 (see FIG. 9) disposed below the sacrificial MRAM stack. According to some embodiments and as shown in FIG. 10, further patterning removes/opens portions of the etch stop liner 901 and the fourth ILD 902 to form patterned metal trenches and fully aligned vias 1002, 1003, 1004 for Mx+1 and Vx features.

Figure 11:
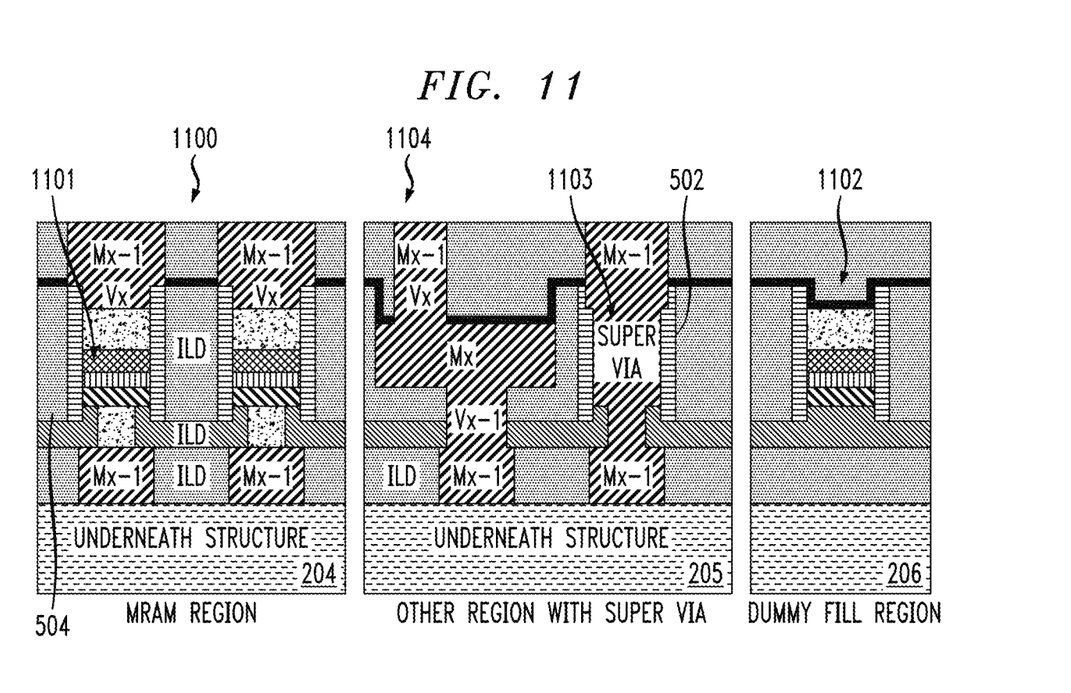

Referring to FIG. 11, according to some embodiments, following one or more metallization processes filling the super via trench 1001, and the patterned trenches/fully aligned vias 1002, 1003, 1004 (see FIG. 10), an MRAM device 1100 includes a plurality of MRAM cells 1101 in the first region 204 (i.e., an MRAM region), and a dummy MRAM pillar 1102 in the third region 206 (i.e., a dummy fill region), and a super via 1103 in the second region 205. According to example embodiments, the fully aligned vias, Vx, are aligned to the respective patterned MRAM stacks, without overlapping or contacting the low-k ILD 504.

According to some embodiments, in the second region 205, the super via 1103 connects Mx+1 (upper metal features) to Mx−1 (lower metal features), where a sidewall spacer 502 is disposed on sidewalls of the super via and the patterned MRAM stacks. According to some example embodiments, the sidewall spacer 502 can prevent the super via 1103 from shorting with any nearby metal lines or via interconnects. According to at least one embodiment, the second region 205 further includes metal structures 1104 (e.g., including metal lines (Mx), upper and lower via interconnects (Vx, and Vx−1, respectively), and lower and upper metal lines (Mx−1, and Mx+1, respectively), etc.).

Figure 12:
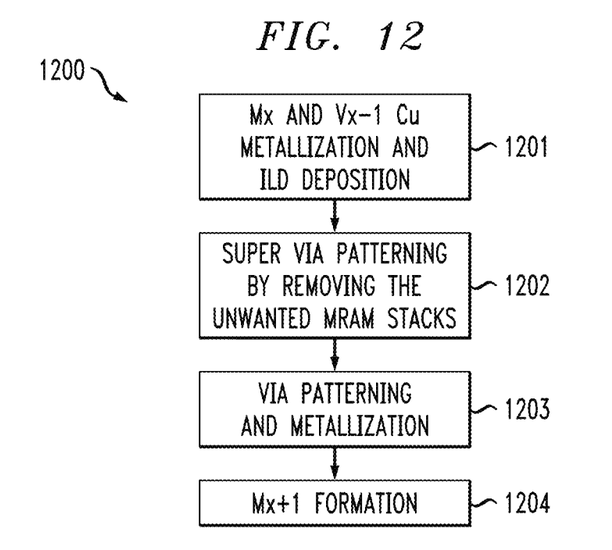
FIG. 12 is method of manufacturing an embedded MRAM integrated with a super via and a dummy fill according to one or more embodiments of the present invention.
Figure 14:
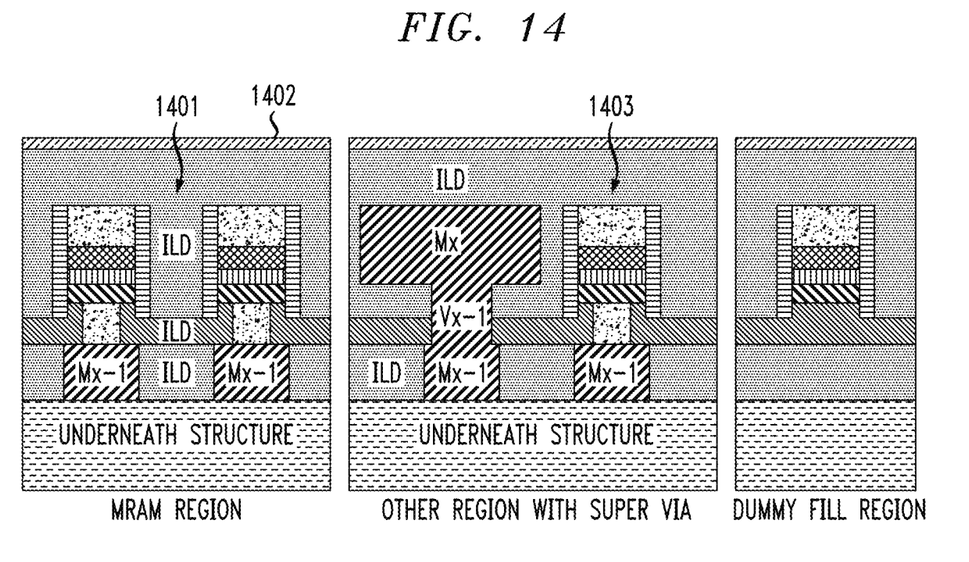
FIG. 14 is cross-section view of a device at different steps in a manufacturing process of FIG. 12 and FIG. 13 according to one or more embodiments of the present invention.
Figure 15:
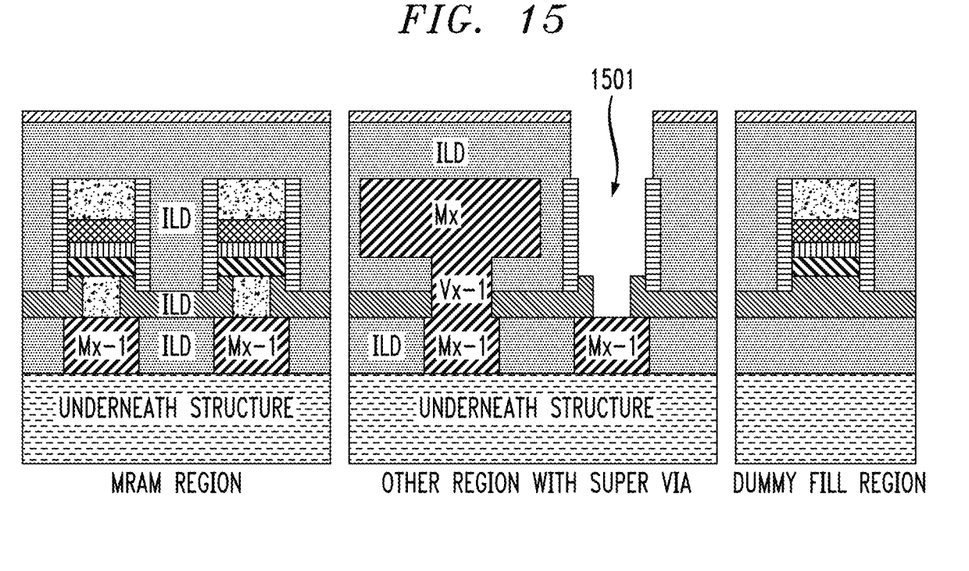
FIG. 15-17 are cross-section views of a device at different steps in a manufacturing process of FIG. 12 according to one or more embodiments of the present invention.
Figure 16:
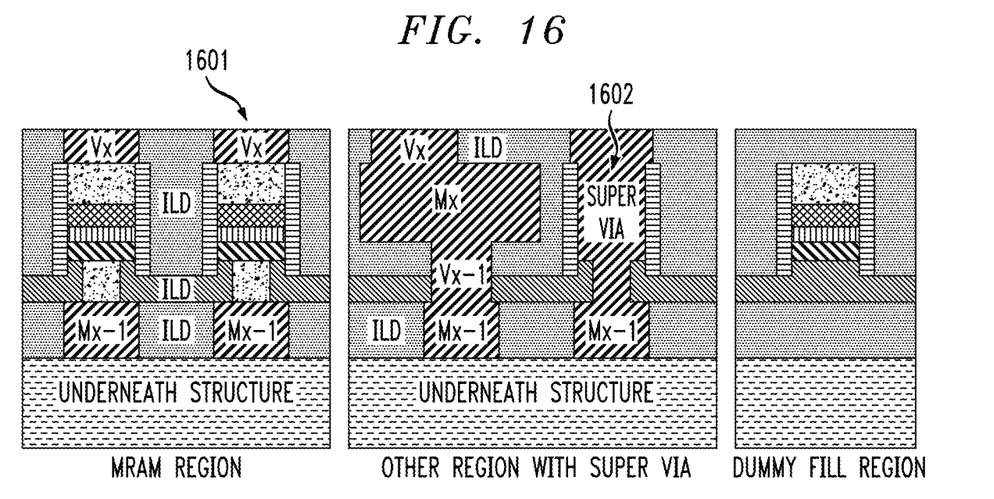
Figure 17:
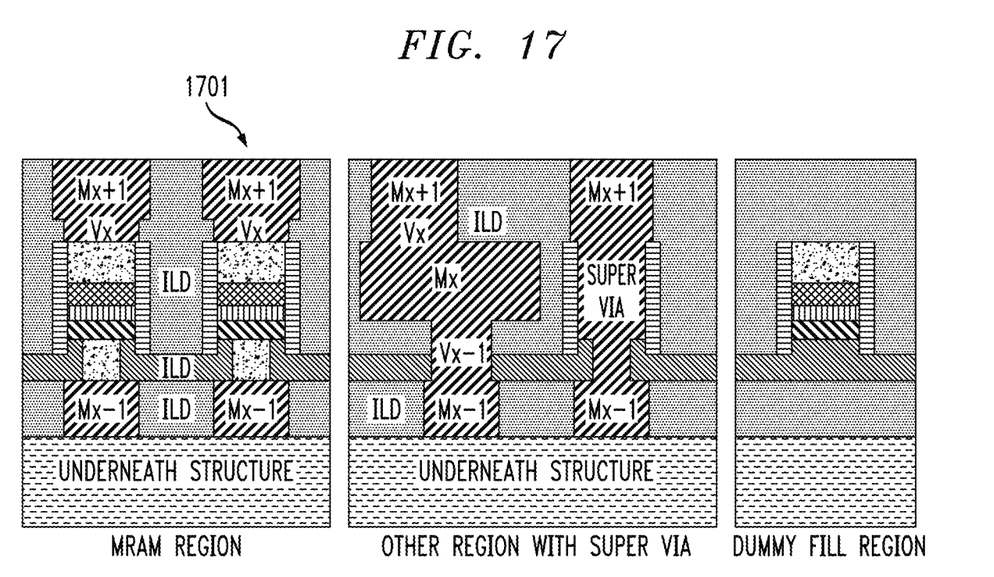

FIG. 12 is method 1200 of manufacturing an embedded MRAM integrated with a super via and a dummy fill according to one or more embodiments of the present invention. According to some embodiments, the method 1200 begins from the structure shown in FIG. 7 (see also step 108 in FIG. 1) and includes, at step 1201, a deposition of a fourth ILD (see fourth ILD 1401, FIG. 14) and a hardmask (see hardmask 1402) suitable for patterning. According to example embodiments, at step 1202 the method can include forming a super via trench (see super via trench 1501, FIG. 15) by a super via patterning exposing a sacrificial MRAM stack (see sacrificial MRAM stack 1403, FIG. 14), followed by the removal of the sacrificial MRAM stack. According to some embodiments, at step 1203 the method can include a via patterning and metallization forming top vias (Vx) (see top via 1601, FIG. 16) and a super via 1602. It should be understood that according to some embodiments, the super via patterning at step 1202 and the via patterning at step 1203 can each include patterning the hardmask to expose a portion of the forth ILD for etching. According to example embodiments, at step 1204 the method includes forming top metal lines (Mx+1) (see top metal lines 1701, FIG. 17).

Figure 13:
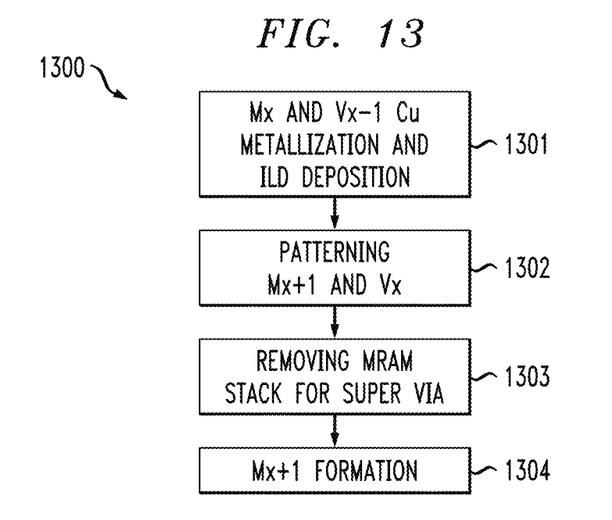
FIG. 13 is method of manufacturing an embedded MRAM integrated with a super via and a dummy fill according to one or more embodiments of the present invention.
Figure 18:
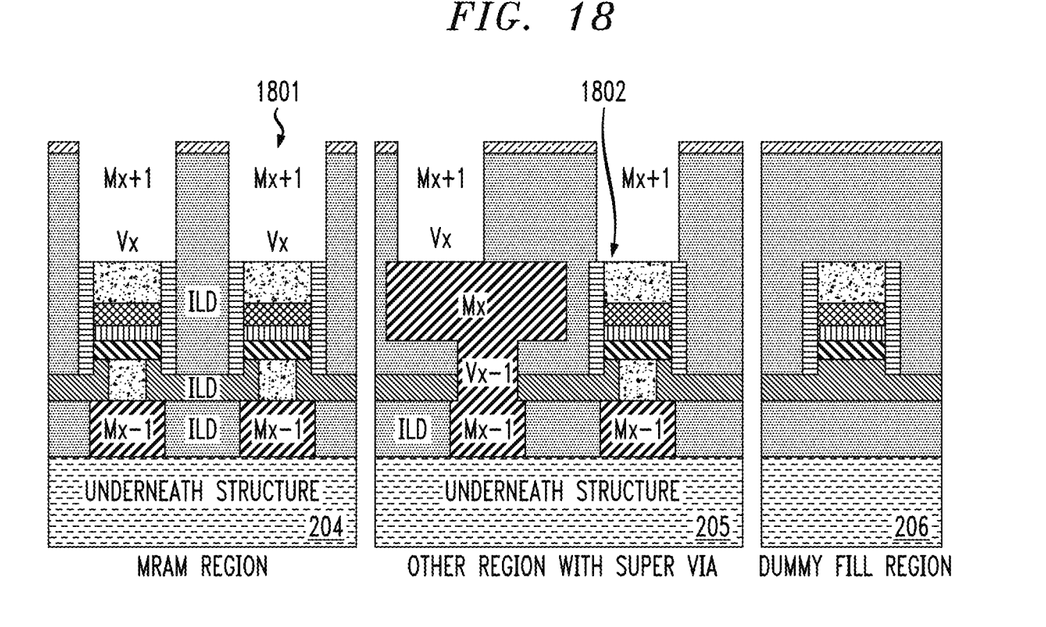
FIG. 18-20 are cross-section views of a device at different steps in a manufacturing process of FIG. 13 according to one or more embodiments of the present invention.
Figure 19:
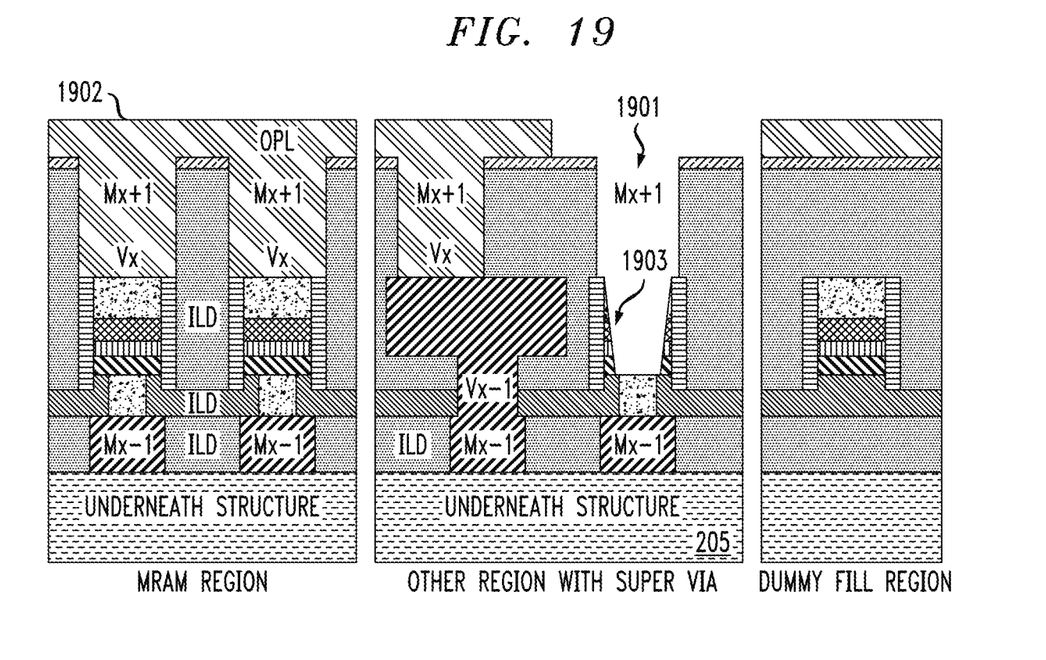
Figure 20:
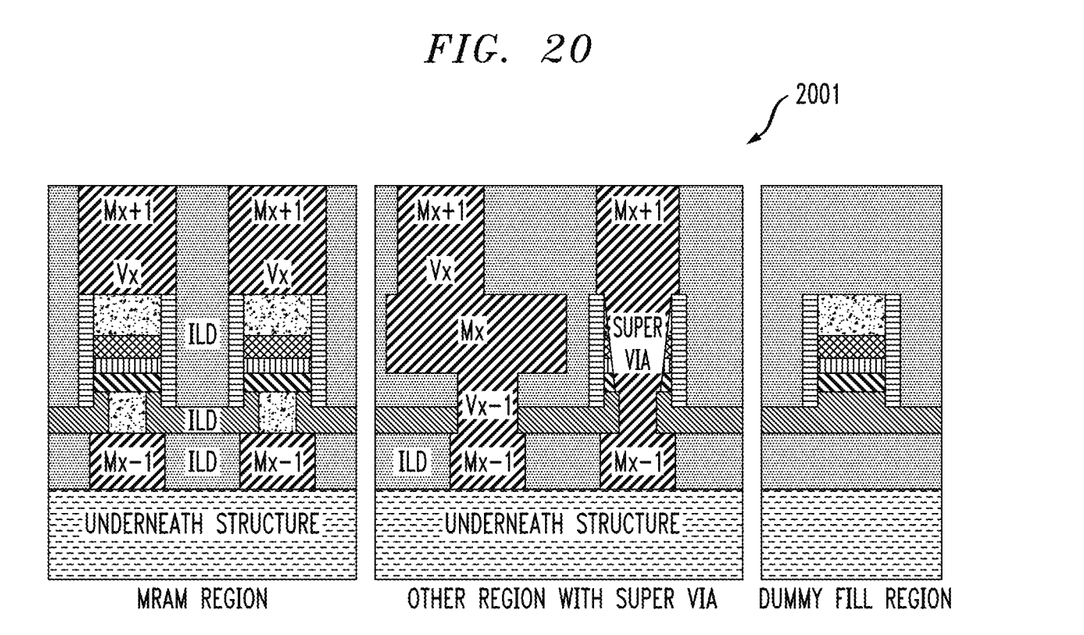

FIG. 13 is method 1300 of manufacturing an embedded MRAM integrated with a super via and a dummy fill according to one or more embodiments of the present invention. According to some embodiments, the method 1300 begins from the structure shown in FIG. 7 (see also step 108 in FIG. 1) and includes, at step 1301, a deposition of a fourth ILD (see fourth ILD 1401, FIG. 14) and a hardmask (see hardmask 1402) suitable for patterning. According to example embodiments, the method can include a patterning for via and metal lines (see trench and via 1801, FIG. 18) at step 1302 exposing the MRAM stacks and the metal line Mx in the first region 204 and the second region 205. It should be understood that according to some embodiments, the via patterning at step 1302 can each include patterning the hardmask to expose a portion of the forth ILD for etching to form openings for the vias and metal contacts. According to some embodiments, the MRAM stack in the third region 206 is not removed. According to some embodiments, the method can include removing the sacrificial MRAM stack (see sacrificial MRAM stack 1802) at step 1303 from the second region 205 and forming an opening for the super via (see super via trench 1901, FIG. 19). According to example, embodiments, the removal of the sacrificial MRAM stack at step 1303 include depositing and patterning an OPL 1902 to expose the sacrificial MRAM stack. According to some embodiments, a residual portion 1903 of the sacrificial MRAM stack 1802 in the second region 205 can remain. According to example embodiments, the method includes a metallization forming the super via, vias (Vx), and top metal lines (Mx+1) at step 1304 (see metal 2001, FIG. 20), which can include a CMP or the like to remove the hardmask.

Recapitulation:

According to embodiments of the present invention, a device includes a plurality of magnetic random-access memory (MRAM) cells 1101 in a first region 204 of the device; and a dummy MRAM pillar 1102 disposed in a second region of the device (see third region 206), wherein the dummy MRAM pillar is not connected to an active metal feature.

According to embodiments of the present invention, a device includes a plurality of lower metal lines (Mx−1); a plurality of upper metal lines (Mx+1); a plurality of MRAM cells 1101 in a first region 204 of the device and electrically connected to respective ones of the lower metal lines and the upper metal lines; a one super via 1103 disposed in a second region 205 of the device and electrically connected to a respective one of the lower metal lines and a respective one of the upper metal lines; and a dummy MRAM pillar 1102 disposed in a third region 206 of the device.

According to embodiments of the present invention, the device further comprises a first sidewall spacer 502 on a sidewall of the super via.

According to embodiments of the present invention, a method of forming a device comprises forming a plurality of magnetic random-access memory (MRAM) cells in a first region of the device; forming a dummy MRAM pillar (see steps 103-110) in a second region of the device; exposing upper surfaces of the plurality of MRAM cells at step 113; and depositing a metal forming a plurality of upper metal lines over the plurality of MRAM cells at step 114.

The terminology used herein is for the purpose of describing particular embodiments only and is not intended to be limiting of the invention. As used herein, the singular forms "a," "an" and "the" are intended to include the plural forms as well, unless the context clearly indicates other-wise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device comprising:
   a plurality of magnetic random-access memory (MRAM) cells in a first region of the device;
   a dummy MRAM pillar disposed in a second region of the device,
   wherein the dummy MRAM pillar is not connected to an active metal feature;
   a super via disposed in a third region of the device with a sidewall spacer on a sidewall of the super via; and
   a residual portion of a sacrificial MRAM stack disposed between the super via and the sidewall spacer.

2. The device of claim 1, wherein the super via is disposed on a lower metal line and an upper metal line is disposed on the super via.

3. The device of claim 1, further comprising a metal interconnect disposed in the third region.

4. The device of claim 1, wherein the dummy MRAM pillar is disposed entirely on an interlevel dielectric.

5. A device comprising:
   a plurality of lower metal lines;
   a plurality of upper metal lines;
   a plurality of magnetic random-access memory (MRAM) cells in a first region of the device and electrically connected to respective ones of the lower metal lines and the upper metal lines;
   a super via disposed in a second region of the device and electrically connected to a respective one of the lower metal lines and a respective one of the upper metal lines;
   a dummy MRAM pillar disposed in a third region of the device;
   a first sidewall spacer on a sidewall of the super via; and
   a residual portion of a sacrificial MRAM stack disposed between the super via and the first sidewall spacer.

6. The device of claim 5, further comprising a first sidewall spacer on a sidewall of the super via.

7. The device of claim 5, further comprising:
   a plurality of second sidewall spacers on sidewalls of the MRAM cells.

8. The device of claim 5, further comprising a metal line in the second region electrically connected to a respective one of the lower metal lines and a respective one of the upper metal lines.

9. The device of claim 5, wherein the dummy MRAM pillar is disposed entirely on an interlevel dielectric.

10. The device of claim 5, wherein the dummy MRAM pillar is capped by an etch stop liner.

11. The device of claim 5, further comprising:
an etch stop liner with openings exposing upper surfaces of the plurality of MRAM cells and the super via;
a plurality of fully aligned vias disposed between the upper metal lines and the MRAM cells; and
a plurality of bottom electrodes disposed between the lower metal lines and the MRAM cells.

12. The device of claim 7, further comprising:
a third sidewall spacer on a sidewall of the dummy MRAM pillar.

13. A method of forming a device comprising:
forming a plurality of magnetic random-access memory (MRAM) cells in a first region of the device;
forming a dummy MRAM pillar in a second region of the device;
exposing upper surfaces of the plurality of MRAM cells;
depositing a metal forming a plurality of upper metal lines over the plurality of MRAM cells;
forming a sacrificial MRAM stack in a third region of the device;
forming a first sidewall spacer on a sidewall of the sacrificial MRAM stack; and
removing at least a portion of the sacrificial MRAM stack to form a super via trench exposing a first lower metal line prior to depositing the metal, wherein depositing the metal further comprises:
forming a super via in the super via trench, wherein a residual portion of the sacrificial MRAM stack is disposed between the super via and the first sidewall spacer.

14. The method of claim 13,
wherein depositing the metal further comprises:
forming a super via upper metal line over the super via, wherein the super via electrically connects the super via upper metal line to the first lower metal line.

15. The method of claim 14, further comprising forming a plurality of lower metal lines, including the first lower metal line, disposed in an interlevel dielectric in the first and third regions.

16. The method of claim 15, further comprising forming a plurality of bottom electrodes contacting each of the lower metal lines in the first region, and at least one, and less than all, of the lower metal lines in the third region.

17. The method of claim 14, further comprising forming a metal line in the third region, the metal line electrically connected to a second lower metal line.

18. The method of claim 14, further comprising forming an etch stop liner over the device prior to removing the portion of the least one sacrificial MRAM stack to form the super via trench.

19. The method of claims 14, further comprising forming a plurality of second sidewall spacers on sidewalls of the MRAM cells, wherein the etch stop is disposed around the plurality of MRAM cells and the super via, and overlaps the first sidewall spacer and the second sidewall spacers.

20. The method of claim 14, further comprising:
forming a hardmask over the device prior to removing the portion of the sacrificial MRAM stack to form the super via trench; and
patterning the hardmask over the sacrificial MRAM stack.

* * * * *